US011469458B2

(12) United States Patent
Chang

(10) Patent No.: US 11,469,458 B2
(45) Date of Patent: Oct. 11, 2022

(54) SYSTEM AND METHOD FOR MONITORING TEMPERATURE OF BATTERY PACK IN STORAGE

(71) Applicant: STL Technology Co., Ltd., Kaohsiung (TW)

(72) Inventor: Cooper Chang, Kaohsiung (TW)

(73) Assignee: STL TECHNOLOGY CO., LTD., Kaohsiung (TW)

( * ) Notice: Subject to any disclaimer, the term of this patent is extended or adjusted under 35 U.S.C. 154(b) by 355 days.

(21) Appl. No.: 16/832,473

(22) Filed: Mar. 27, 2020

(65) Prior Publication Data

US 2021/0135302 A1 May 6, 2021

(30) Foreign Application Priority Data

Oct. 31, 2019 (CN) .......................... 201911055823.3

(51) Int. Cl.
*H01M 10/48* (2006.01)
*H01M 10/42* (2006.01)
*G01R 31/396* (2019.01)
*G01R 31/371* (2019.01)
*H01M 50/20* (2021.01)

(52) U.S. Cl.
CPC ........ *H01M 10/486* (2013.01); *G01R 31/371* (2019.01); *G01R 31/396* (2019.01); *H01M 10/425* (2013.01); *H01M 50/20* (2021.01); *H01M 2010/4278* (2013.01)

(58) Field of Classification Search
CPC ............... G01R 31/371; G01R 31/374; G01R 31/3865; G01R 31/392; G01R 31/396; H01M 10/425; H01M 10/482; H01M 10/486; H01M 2010/4271; H01M 2010/4278; H01M 50/20; Y02E 60/10
See application file for complete search history.

(56) References Cited

U.S. PATENT DOCUMENTS

| 2011/0130983 | A1* | 6/2011 | Yang .................... G01R 31/396 702/63 |
| 2017/0117725 | A1* | 4/2017 | Hendricks .............. G01K 1/026 |
| 2017/0245854 | A1* | 8/2017 | Zemlok ............ A61B 17/07207 |

* cited by examiner

*Primary Examiner* — Victoria H Lynch
(74) *Attorney, Agent, or Firm* — Chun-Ming Shih; HDLS IPR Services

(57) ABSTRACT

The invention provides a battery monitoring system comprising a battery monitoring device and at least one battery pack in storage. The battery pack comprises at least one battery core, a controller, and a temperature sensor. When the controller of the battery pack senses that a temperature of the battery core is higher than a safe temperature value, it issues an alarm signal, and directly transmits the alarm signal to the battery monitoring device in a short distance wireless communication, or transmits the alarm signal to the battery monitoring device via a multi-hop transmission of multiple battery packs in the short distance wireless communication. The alarm signal received by the battery monitoring device will be displayed on an alarm notification unit. Accordingly, the battery monitoring system can instantly monitor the temperature of the battery pack in storage to reduce the probability of burning or exploding of the battery pack.

19 Claims, 5 Drawing Sheets

SYSTEM AND METHOD FOR MONITORING TEMPERATURE OF BATTERY PACK IN STORAGE

This non-provisional application claims priority claim under 35 U.S.C. § 119 (a) on China Patent Application No. 201911055823.3 filed Oct. 31, 2019, the entire contents of which are incorporated herein by reference.

FIELD OF THE INVENTION

The present invention relates to a system and method for monitoring battery pack in storage, more particularly, a system and method for monitoring temperature of battery pack in storage.

BACKGROUND

A battery monitoring system is usually configured in a production line of battery pack. The battery monitoring system monitoring the temperature of the battery pack can avoid an overheating of the battery pack under the production. After the production of each battery pack is completed in succession, the producer takes out the battery packs from the production line, stores the battery packs into a box in a way of stack, and packs the box storing the battery packs.

In the past, the battery packs and its storage box are usually not provided with a communication interface. When the battery packs are packaged in the box, they will be isolated from an outside world. When the packaged battery packs overheats during storage or transportation, a warehouse manager or a delivery person is unable to detect the overheating of the battery packs unless an exploding or firing of the battery packs. Accordingly, it will easy form a serious fire if the packaged battery packs happens thermal runaway.

SUMMARY

It is one objective of the present invention to provide a battery monitoring system, in which monitors a temperature of at least one battery pack in storage in a way of a short distance wireless communication, and immediately transmits an alarm to a manager of the battery pack when the battery pack has been overheated, so that the manager of the battery pack can handle the overheated battery pack as soon as possible, and therefore the probability of burning or exploding of the battery pack can be reduced.

It is another objective of the present invention to provide a battery monitoring system, which comprises a battery monitoring device and at least one battery pack. When the temperature of the battery pack is higher than a safe temperature value, the battery pack will issue an alarm signal. The alarm signal issued by the overheated battery pack can directly transmit to the battery monitoring device in the way of the short distance wireless communication, or transmit to the battery monitoring device via a multi-hop transmission of multiple battery packs in the way of the short distance wireless communication. Afterwards, the battery monitoring device can monitor the temperature of the battery pack in storage according to the alarm signal received.

It is another objective of the present invention to provide a battery monitoring system, wherein the alarm signal issued by the battery pack includes an overheating message. Each of battery packs will sense the temperature of the battery cell itself to obtain a battery temperature value. A highest battery temperature value can be determined from the battery temperature values of the overheating battery packs. The highest battery temperature value and the number of the overheating battery packs will be embedded in the overheating message. When the manager receives the alarm signal by the battery monitoring device, he can know whether these battery packs happens a thermal runaway or a flame spread according to the highest battery temperature value and the number of the overheating battery packs of the overheating message.

It is another objective of the present invention to provide a battery monitoring system, wherein the battery pack is operated in a sleep mode before the battery pack does not overheat, such that can reduce a power consumption of the battery pack, and therefore extend a time of the battery monitoring device monitoring the battery pack in storage.

To achieve the above objective, the present invention provides a system for monitoring temperature of battery pack in storage, comprising: a battery monitoring device comprising a first short distance wireless communication module and an alarm notification unit connected to the first short distance wireless communication module; and at least one battery pack in storage, wherein the battery pack comprises a battery cell, a controller, a second short distance wireless communication module, and a temperature sensor, the controller is connected to the cell, the second short distance wireless communication module, and the temperature sensor, a safe temperature value is set in the controller, the temperature sensor senses a temperature of the battery cell to generate a battery temperature value, the battery pack is connected to the first short distance wireless communication module of the battery monitoring device via the second short distance wireless communication module, or the battery pack is connected to the second short distance wireless communication module of the at least one adjacent other battery pack via the second short distance wireless communication module; wherein, if the battery temperature value of the battery pack is higher than the safe temperature value, the controller of the battery pack issues an alarm signal, and directly transmits the alarm signal to the battery monitoring device in a short distance wireless communication, or transmits the alarm signal to the battery monitoring device via a multi-hop transmission in the short distance wireless communication; when the battery monitoring device receives the alarm signal, the alarm signal will be displayed on the alarm notification unit.

In one embodiment of the present invention, wherein the controller of the battery pack is operated in a sleep mode in advance, if the battery temperature value of the battery pack is higher than the safe temperature value, the operation mode of the controller of the battery pack will be changed from the sleep mode to a high alarm mode, and the controller of the battery pack will issue the alarm signal.

In one embodiment of the present invention, wherein the controller of the battery pack is operated in a sleep mode in advance, if the battery temperature value of the battery pack is not higher than the safe temperature value and the battery pack receives the alarm signal of the other battery pack, the operation mode of the controller of the battery pack will be changed from the sleep mode to a low alarm mode, and the battery pack assists to transmit the alarm signal of the other battery pack in a way of the short distance wireless communication.

In one embodiment of the present invention, when the controller of the battery pack is operated in the low alarm mode, if the battery temperature value of the battery pack is higher than the safe temperature value, the operation mode of the controller of the battery pack will be changed from the low alarm mode to a high alarm mode, and the controller of the battery pack will issue the alarm signal.

In one embodiment of the present invention, wherein the alarm signal includes an overheating message, when the battery monitoring device receives the alarm signal, the microprocessor of the battery monitoring device can know that the alarm signal is an alarm signal indicating that the battery pack is overheated by recognizing the overheating message from the alarm signal.

In one embodiment of the present invention, wherein the controller of the battery pack comprises a temperature recording unit, if the battery temperature value of the battery pack is higher than the safe temperature value, the controller of the battery pack marks the battery temperature value as an alarm temperature value, records the alarm temperature value in the temperature recording unit, and embeds the alarm temperature value in the overheating message of the alarm signal to be transmitted.

In one embodiment of the present invention, wherein if the battery temperature value of the battery pack is higher than the safe temperature value and the battery pack receives the alarm signals of the other battery packs, the controller of the battery pack extracts the alarm temperature values of the other battery packs from the overheating messages of the alarm signals received, recognizes a highest alarm temperature value from the alarm temperature value recorded in the temperature recording unit and the alarm temperature values of the other battery packs extracted, records the highest alarm temperature value in the temperature recording unit, and embeds the highest alarm temperature value in the overheating message of the alarm signal to be transmitted.

In one embodiment of the present invention, wherein if the battery temperature value of the battery pack is not higher than the safe temperature value and the battery pack receives the alarm signals of the other battery packs, the controller of the battery pack extracts the alarm temperature values of the other battery packs from the overheating messages of the alarm signals received, recognizes a highest alarm temperature value from the alarm temperature values of the other battery packs extracted, records the highest alarm temperature value to the temperature recording unit, and embeds the highest alarm temperature value in the overheating message of the alarm signal to be transmitted.

In one embodiment of the present invention, wherein the controller of the battery pack comprises a counter, the counter counts a count value for indicating the number of the overheating battery packs, if the battery temperature value of the battery pack is higher than the safe temperature value, the controller of the battery pack counts the count value as 1 by the counter, and embeds the count value to the overheating message of the alarm signal to be transmitted.

In one embodiment of the present invention, wherein if the battery temperature value of the battery pack is higher than the safe temperature value and the battery pack receives the alarm signals of the other battery packs, the controller of the battery pack extracts the count values of the other battery packs from the overheating messages of the alarm signals received, recognizes a highest count value from the count values extracted, adds 1 to the highest count value to obtain an updated highest count value, records the updated highest count value in the counter, and embeds the updated highest count value in the overheating message of the alarm signal to be transmitted.

In one embodiment of the present invention, wherein if the battery temperature value of the battery pack is not higher than the safe temperature value and the battery pack receives the alarm signals of the other battery packs, the controller of the battery pack extracts the count values of the other battery packs from the overheating messages of the alarm signals received, recognizes a highest count value from the count values extracted, records the highest count value in the counter, and embeds the highest count value in the overheating message of the alarm signal to be transmitted.

In one embodiment of the present invention, wherein the alarm notification unit is a display, a light emitter, a buzzer, or a human-machine interface capable of displaying signal.

In one embodiment of the present invention, wherein the first short distance wireless communication module or the second short distance wireless communication module is a wireless communication module conforming to Bluetooth standard transmission specification, WiFi standard transmission specification, ZigBee standard transmission specification, or ANT standard transmission specification.

The present invention further provides a method for monitoring temperature of battery pack in storage, which is applied to a battery monitoring system, the battery monitoring system comprising a battery monitoring device and at least one battery pack in storage, the battery monitoring device comprising an alarm notification unit, the battery pack comprising a battery cell, a controller, and a temperature sensor, wherein a safe temperature value is set in the controller, and the temperature sensor is used to sense a temperature of the battery cell in the battery pack to generate a battery temperature value, the method comprising steps of: establishing a communication connection between the battery pack and the battery monitoring device or between the battery pack and the other battery packs in a way of a short distance wireless communication; monitoring whether the battery temperature value of the battery pack is higher than the safe temperature value by the controller of the battery pack; issuing an alarm signal by the controller of the battery pack if the battery temperature value of the battery pack is higher than the safe temperature value; requiring the controller of the battery pack to directly transmit the alarm signal to the battery monitoring device in the way of the short distance wireless communication, or requiring the controller of the battery pack to transmit the alarm signal to the battery monitoring device via the a multi-hop transmission in the way of the short distance wireless communication; and displaying the alarm signal received by the battery monitoring device on the alarm notification unit.

DETAILED DESCRIPTION OF THE PREFERRED EMBODIMENTS

Figure 1:
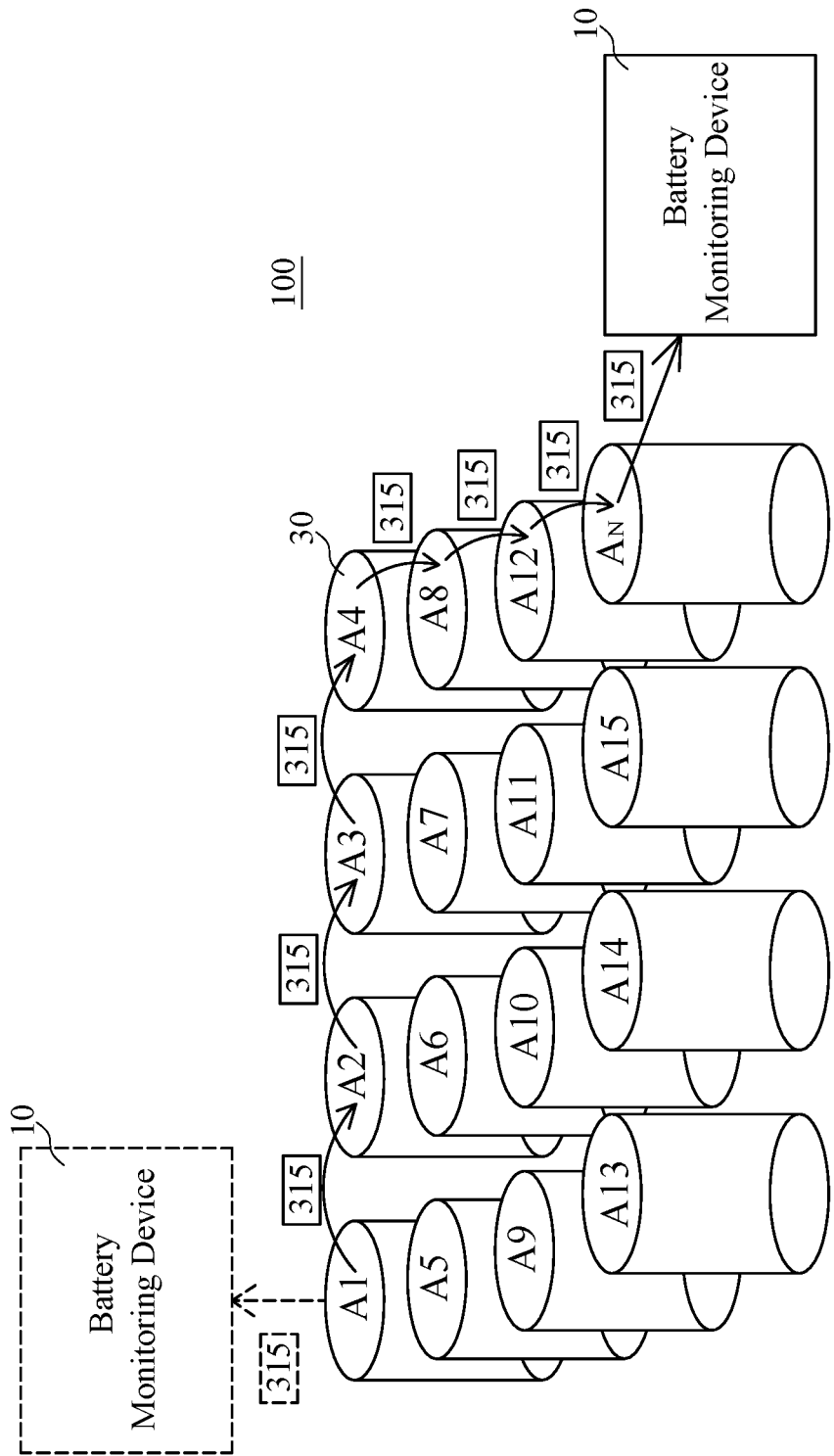
FIG. 1 is an architecture diagram of a battery monitoring system of the present invention.
Figure 2:
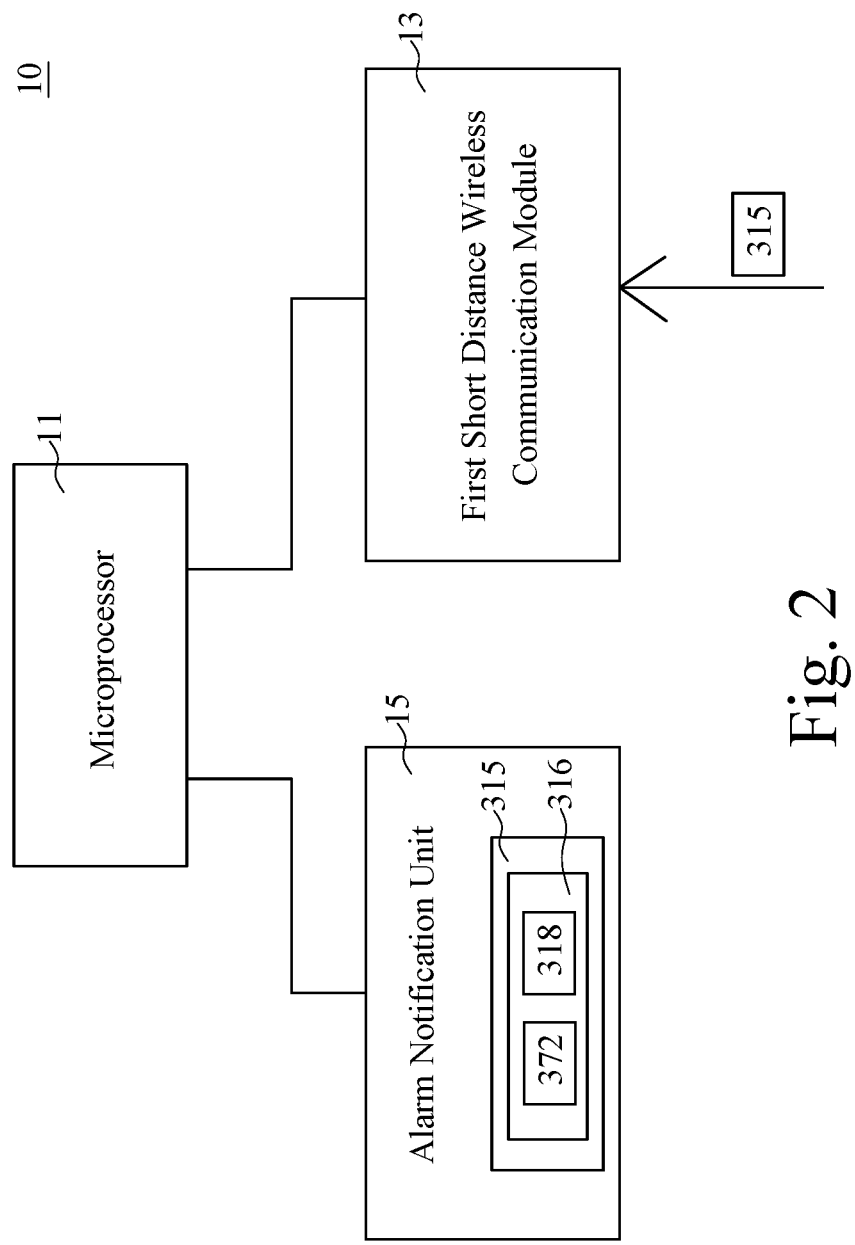
FIG. 2 is a circuit diagram of a battery monitoring device of the present invention.
Figure 3:
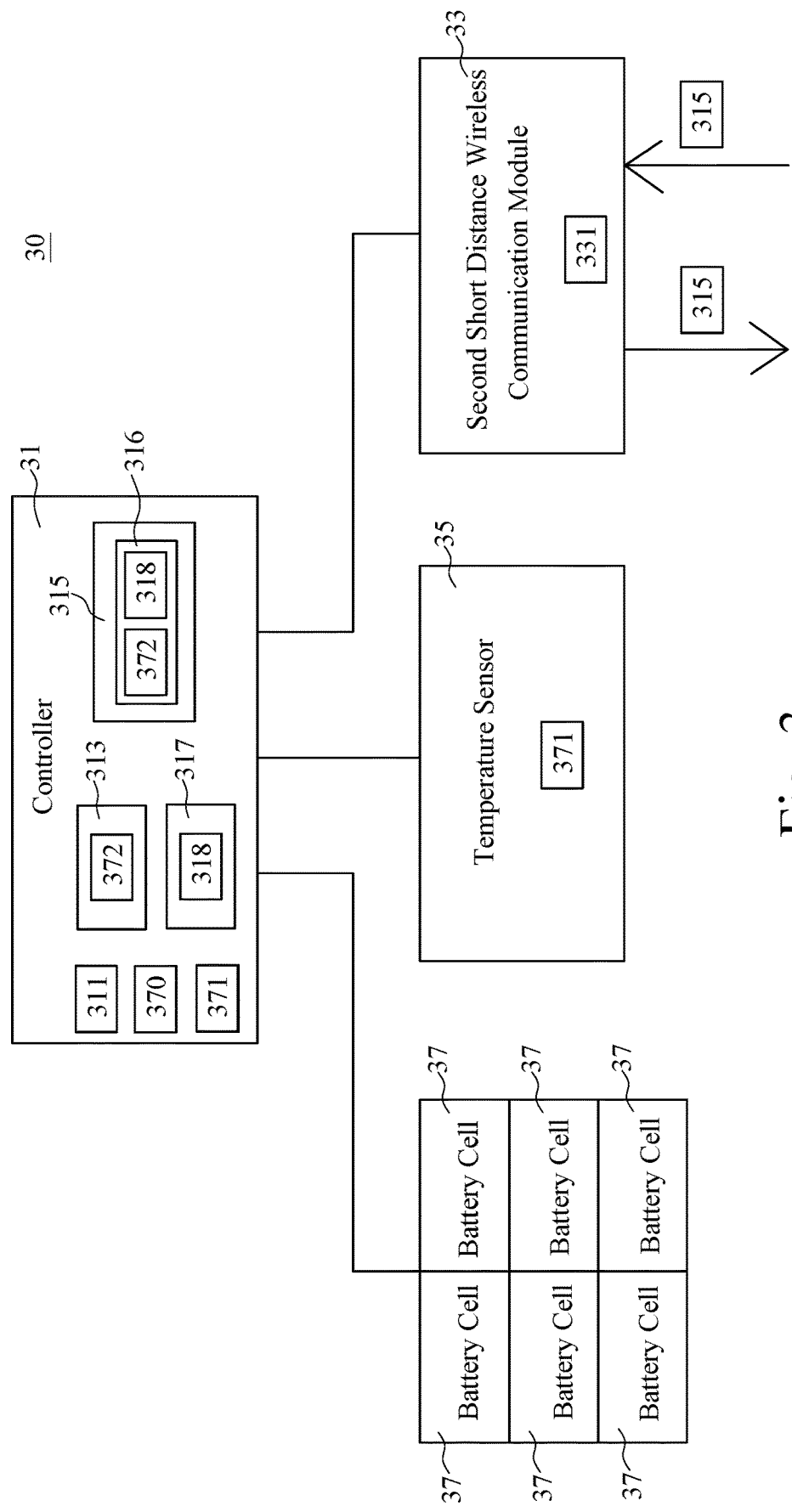
FIG. 3 is a circuit diagram of a battery pack of the present invention.
Figure 4:
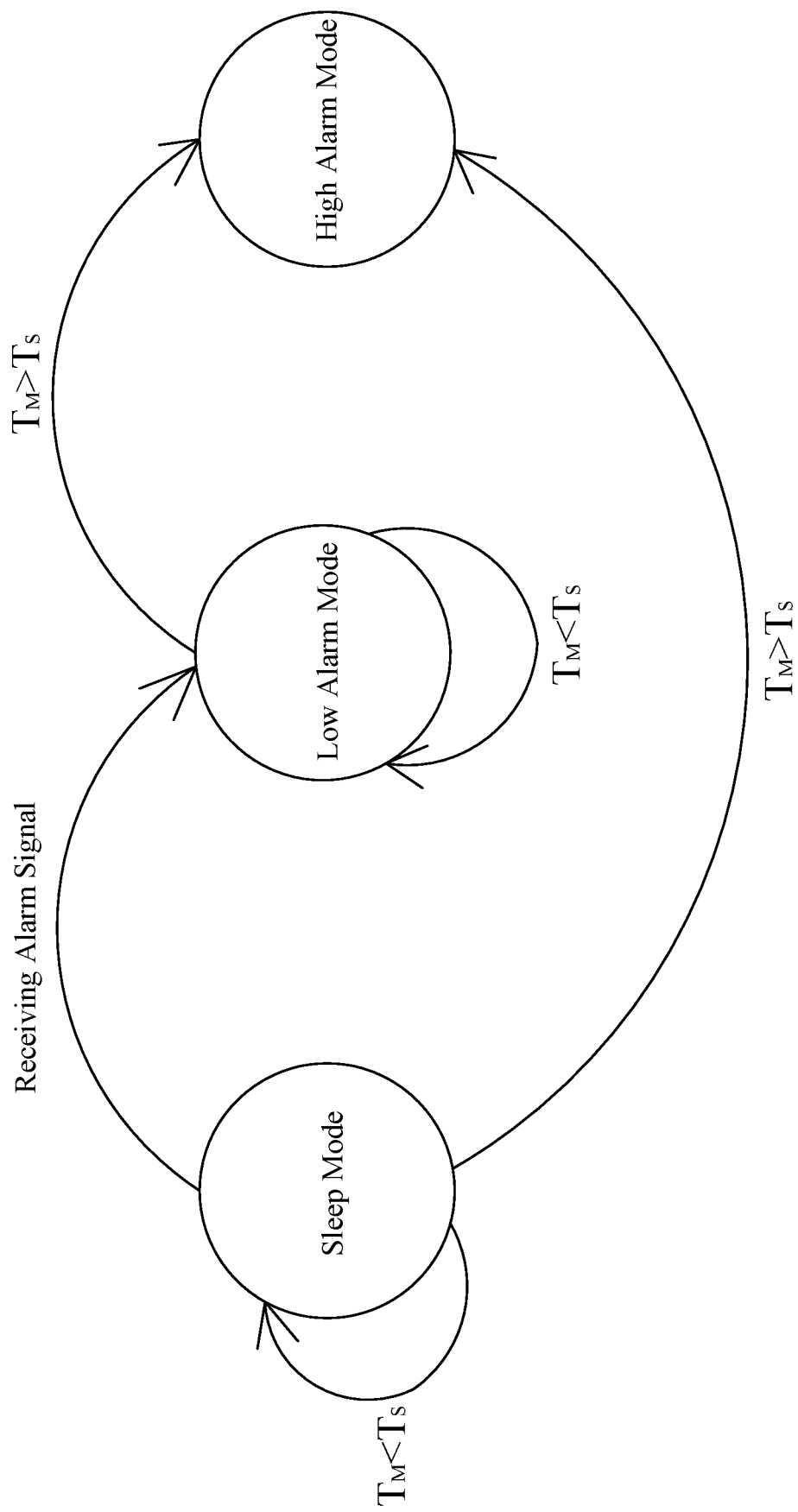
FIG. 4 is a state machine of an operation mode of a controller of the battery pack of the present invention.

Referring to FIG. 1, FIG. 2, FIG. 3, and FIG. 4, there are shown an architecture diagram of a battery monitoring system of the present invention, a circuit diagram of a battery monitoring device of the present invention, a circuit diagram of a battery pack of the present invention, and a state machine of an operation mode of a controller of the battery pack of the present invention. The battery monitoring system 100 comprises a battery monitoring device 10 and one or more battery packs 30. For example, battery pack A1, battery pack A2, battery pack A3, . . . , battery pack $A_N$. When the battery pack 30 overheats, it will actively issue an alarm signal 315. The alarm signal 315 will be transmitted to the battery monitoring device 10 in a way of short distance wireless communication. Afterwards, the battery monitoring device 10 performs the monitoring of temperature of the overheating battery pack 30 in storage according to the alarm signal 315 received.

The battery packs 30 of the present invention are packaged and stored in a fixed place, for example, warehouse center, or packaged, and transported by a vehicle. In the present invention, the battery monitoring device 10 may be an electronic device carried by a manager (such as a storage person or a transportation person), or an electronic device fixed in a place where is stored with the battery packs 30.

The battery monitoring device 10 comprises a microprocessor 11, a first short distance wireless communication module 13, and an alarm notification unit 15. The microprocessor 11 is connected to the first short distance wireless communication module 13 and the alarm notification unit 15. Each of the battery packs 30 comprises a controller 31, a second short distance wireless communication module 33, a temperature sensor 35, and at least one battery cell 37. The controller 31 is connected to the second short distance wireless communication module 33, the temperature sensor 35, and the battery cell 37. The battery pack 30 is connected to the at least one adjacent battery pack 30 or the adjacent battery monitoring device 10 via a way of short distance wireless communication. For example, the battery pack (A1) is connected to the second short distance wireless communication modules 33 of the adjacent battery packs (A2) and (A5) via the second short distance wireless communication module 33, and the battery pack ($A_N$) is connected to the second short distance wireless communication modules 33 of the adjacent battery packs (A12) and (A15) via the second short distance wireless communication module 33, and connected to the first short distance wireless communication module 13 of the adjacent battery monitoring device 10 via the second short distance wireless communication module 33. In the present invention, the first short distance wireless communication module 13 or the second short distance wireless communication module 33 is a wireless communication module conforming to Bluetooth standard transmission specification, WiFi standard transmission specification, ZigBee standard transmission specification, ANT standard transmission specification, or other communication module capable of communicating in a short distance.

An operation mode of the controller 31 of the battery pack 30 comprises a sleep mode, a low alarm mode, and a high alarm mode. The controller 31 of the battery pack 30 comprises a firmware 311. A program for monitoring a temperature of the battery pack 30, and a program for monitoring whether an alarm signal is received are defined in the firmware 311. In the present invention, whatever the controller 31 of the battery pack 30 is operated in the sleep mode, the low alarm mode, or the high alarm mode, it will periodically monitor the temperature of the battery pack 30 and monitor whether the alarm signals 315 transmitted by the other battery packs 30 are received.

When the battery monitoring system 100 initiates to operate, the controller 31 of the battery pack 30 first operates in the sleep mode, which is a power saving mode. A safe temperature value ($T_S$) 370 is set in the controller 31 of the battery pack 30. The temperature sensor 35 senses the temperature of the battery pack 30 to generate a battery temperature value ($T_M$) 371. When the controller 31 of the battery pack 30 is operated in the sleep mode, it will be periodically waked to monitor whether the battery temperature value ($T_M$) 371 is higher than the safe temperature value ($T_S$) 370. The controller 31 of the battery pack 30 continues to operate in the sleep mode if the battery temperature value ($T_M$) 371 monitored is lower than the safe temperature value ($T_S$) 370, which indicates that the current temperature of the battery pack 30 is safe. On the contrary, the operation mode of the controller 31 of the battery pack 30 will change from the sleep mode to the high alarm mode if the battery temperature value ($T_M$) 371 monitored has been higher than the safe temperature value ($T_S$) 370, which indicates that the current temperature of the battery pack 30 is overheated. The controller 31 of the battery pack 30 operated in the high alarm mode will immediately issue an alarm signal 315, and transmit the alarm signal 315 via the second short distance wireless communication module 33.

Further, the controller 31 of the battery pack 30 operated in the sleep mode is also periodically waked to monitor whether the alarm signals 315 transmitted by the other battery packs 30 are received. The operation mode of the controller 31 of the battery pack 30 will change from the sleep mode to the low alarm mode if the battery pack 30 receives the alarm signals 315 transmitted by the other battery packs 30 via the second distance wireless communication module 33. The controller 31 of the battery pack 30 operated in the low alarm mode can be used to assist in transmitting the alarm signal 315 of other battery pack 30 via the second distance wireless communication module 33.

Similarly, when the controller 31 is operated in the low alarm mode, it can also monitor the temperature of the battery pack 30 besides monitor whether to receive the alarm signals 315 of other battery packs 30. The operation mode of the controller 31 will be changed from the low alarm mode to the high alarm mode if the controller 31 monitors that the temperature of the battery pack 30 is overheated, for example, the battery temperature value ($T_M$) 371 monitored has been higher than the safe temperature value ($T_S$) 370. The controller 31 of the battery pack 30 operated in the high alarm mode will immediately issue the alarm signal 315, and transmit the alarm signal 315 via the second short distance wireless communication module 33.

The second short-range wireless communication module 33 of each of the battery packs 30 has a signal transmission range 331. If the battery monitoring device 10 is located within the signal transmission range 331 of the second short-range wireless communication module 33 of the overheating battery pack 30, it will directly receive the alarm signal 315 issued by the overheating battery pack 30 via the first short-range wireless communication module 13. For example, if the battery pack (A1) 30 is an overheating battery pack 30, the battery monitoring device 10 is next to the battery pack (A1) 30 and located within the signal transmission range 331 of the second short-range wireless communication module 33 of the battery pack (A1) 30, the battery monitoring device 10 can directly receive the alarm signal 315 issued by the overheating battery pack (A1) 30 via the first short-range wireless communication module 13. On the contrary, if the battery pack (A1) 30 is an overheating battery pack 30, the battery monitoring device 10 is located outside the signal transmission range 331 of the second short-range wireless communication module 33 of the overheating battery pack (A1) 30, the alarm signal 315 issued by the overheating battery pack (A1) 30 will be transmitted to the battery monitoring device 10 according to a multi-hop transmission of multiple battery packs 30 in the short distance wireless communication. For example, the battery monitoring device 10 is next to the battery pack ($A_N$) 30 and located outside the signal transmission range 331 of the second short distance wireless communication module 33 of the overheating battery pack (A1) 30, the alarm signal 315 issued by the overheating battery pack (A1) 30 will be transmitted to the battery monitoring device 10 via a multi-hop transmission of multiple battery packs 30, for example, A2→A3→A4→A8→A12→AN. Besides, the above described path (A2→A3→A4→A8→A12→AN) of the multi-hop transmission is only one example, the alarm signal 315 issued by the overheating battery pack (A1) 30 may be transmitted to the battery monitoring device 10 according to other path of the multi-hop transmission. For example, the alarm signal 315 issued by the overheating battery pack (A1) 30 will be transmitted to the battery monitoring device 10 via the path ($A5→A6→A7→A11→A15→A_N$).

When the microprocessor 11 of the battery monitoring device 10 receives the alarm signal 315 of the overheating battery pack 30 via the first short distance communication module, the alarm signal 315 will be displayed on the alarm notification unit 15. The alarm notification unit 15 is a display, a light emitter, a buzzer, or a human-machine interface capable of displaying signal. When the manager of the battery packs 30, for example, warehouse manager or delivery person, sees or hears the alarm signal 315 displayed from the alarm notification unit 15 of the battery monitoring system 10, he can immediately perform an overheating protection for the battery packs 30 in storage.

In the present invention, the alarm signal 315 is an RF signal including an overheating message 316. The overheating message 316 is included in the alarm signal 315 in a form of label. When the battery monitoring device 10 receives the alarm signal 315 of the overheating battery pack 30, the microprocessor 11 of the battery monitoring device 10 can know that the alarm signal 315 is an alarm signal indicating that the battery pack 30 is overheated by recognizing the overheating message 316 from the alarm signal 315. Accordingly, the alarm signal 316 can be distinguished from other non-overheated RF signal by the overheating message 316 embedded therein.

One embodiment of the present invention, the controller 31 of the battery pack 30 further comprises a temperature recording unit 313, which is a component composed of a non-volatile memory or a register. When the controller 31 of the battery pack 30 operates in the sleep mode and monitors that the battery temperature value ($T_M$) 371 is higher than the safe temperature value ($T_S$) 370, the operation mode of the controller 31 of the battery pack 30 will be changed from the sleep mode to the high alarm mode, and then the controller 31 of the battery pack 30 marks the battery temperature value ($T_M$) 371 as an alarm temperature value 372, records the alarm temperature value 372 in the temperature recording unit 313, and embeds the alarm temperature value 372 in the overheating message 316 of the alarm signal 315 to be transmitted. When the controller 31 of the battery pack 30 operates in the high alarm mode and further receives the alarm signals 315 of one or more other battery packs 30, it can extract the alarm temperature values 372 of the other battery packs 30 from the overheating messages 316 of the alarm signals 315 received, recognize a highest alarm temperature value 372 from the alarm temperature value 372 recorded in the temperature recording unit 313 and those alarm temperature values 372 of the other battery packs 30, update the highest alarm temperature value 372 to the temperature recording unit 313, and embed the highest alarm temperature value 372 in the overheating message 316 of the alarm signal 315 to be transmitted.

Otherwise, when the controller 31 of the battery pack 30 operates in the sleep mode, it monitors that the battery temperature value ($T_M$) 371 is not higher than the safe temperature value ($T_S$) 370, but it receives the alarm signals 315 transmitted by the other battery packs 30; at this time the operation mode of the controller 31 of the battery pack 30 is changed from the sleep mode to the low alarm mode, and then the controller 31 of the battery pack 30 extracts the alarm temperature values 372 of the other battery packs 30 from the overheating messages 316 of the alarm signals 315 received, recognizes the highest alarm temperature value 372 from the alarm temperature values 372 of the other battery packs 30, records the highest alarm temperature value 372 in the temperature recording unit 313, and embeds the highest alarm temperature value 372 in the overheating message 316 of the alarm signal 315 to be transmitted.

Afterwards, when the battery monitoring device 10 receives the alarm signal 315 from the adjacent battery pack 30, the highest alarm temperature value 372 embedded in the alarm signal 315 will be displayed on the alarm notification unit 15. Thus, the manager of the battery packs 30 can know whether a thermal runaway has been happened by the highest alarm temperature value 372 displayed on the alarm notification unit 15.

In another embodiment of the present invention, the controller 31 further comprises a counter 317, which records a count value (C) 318. The count value (C) 318 is used to count the number of the overheating battery packs 30. When the controller 31 of the battery pack 30 operates in the sleep mode, if the battery pack 30 overheats, for example, the battery temperature value ($T_M$) 371 is higher than the safe temperature value ($T_S$) 370), the operation mode of the controller 31 of the battery pack 30 will be changed from the sleep mode to the high alarm mode, and then the controller 31 of the battery pack 30 counts the count value (C) 318 as 1, such as C=1, by the counter 317, and embeds the count value (C=1) 318 in the overheating message 316 of the alarm signal 315 to be transmitted. Further, when the controller 31 of the battery pack 30 operates in the high alarm mode and receives the alarm signals 315 of the other battery packs 30, it can extract the count values 318 of the other battery packs 30 from the overheating messages 316 of the alarm signals 315 received, recognize a highest count value (C=X) 318 from the count values 318 extracted, adds 1 to the highest count value (C=X) 318 to obtain an updated highest count value (C=X+1) 318, records the updated highest count value (C=X+1) 318 in the counter 317, and embeds the updated highest count value (C=X+1) 318 in the overheating message 316 of the alarm signal 315 to be transmitted.

Otherwise, when the controller 31 of the battery pack 30 operates in the sleep mode and receives the alarm signals 315 of one or more other battery packs 30, if the battery pack 30 is not overheated, the operation mode of the controller 31 of the battery pack 30 is changed from the sleep mode to the low alarm mode, it extracts the count values 318 of the other battery packs 30 from the overheating messages 316 of the alarm signals 315 received, recognizes a highest count value (C=X) 318 from the count values 318 extracted, records the highest count value (C=X) 318 in the counter 317, and embeds the highest count value (C=X) 318 in the overheating message 316 of the alarm signal 315 to be transmitted.

Afterwards, when the battery monitoring device 10 receives the alarm signal 315 from the adjacent battery pack 30, the highest count value (C) 318 embedded in the alarm signal 315 will be displayed on the alarm notification unit 15. Thus, the manager of the battery packs 30 can know that the number of the overheating battery packs 30 by the highest count value (C) 318 displayed on the alarm notification unit 15, for example, C=5, which represents that there is five overheating battery packs 30, and he can determine whether a flame spread has been happened according to the number of the overheating battery packs 30.

As the above description, the battery monitoring system 100 of the present invention is a battery monitoring system of short distance wireless communication with routingless. The alarm signal 315 issued by the overheating battery pack 30 can be directly transmitted to the battery monitoring device 10 in a way of the short distance wireless communication, or can be transmitted to the battery monitoring device 10 via the multi-hop transmission of multiple battery packs 30 in the way of the short distance wireless communication, such that the battery monitoring device 10 can perform the temperature monitoring to the battery packs 30 in storage according to the alarm signal 315 received. The manager can know whether a thermal runaway or a flame spread has happened by determining the highest alarm temperature value 372 and the highest count value (C) 318 embedded in the overheating message 316 of the alarm signal 315 received. Besides, the controller 31 of the battery pack 30 is operated in the sleep mode in advance before the battery pack 30 do not overheat or receive the alarm signal 315 transmitted by the other battery pack 30, in such a way that can reduce the power consumption of the battery cells 37 of the battery pack 30, and extend a time of the battery monitoring device 10 monitoring the battery pack 30 in storage.

The battery monitoring system 100 of the present invention has a dedicated channel for transmitting the alarm signal 315. The second short distance wireless communication module 33 of the battery pack 30 can transmit the alarm signal 315 via the dedicated channel, and the first short distance wireless communication module 13 of the battery monitoring device 10 can receive the alarm signal 315 transmitted by the battery pack 30 via the dedicated channel. Accordingly, the controller 31 of each of the battery packs 30 needs to monitor whether the other battery pack 30 is transmitting signals before transmitting the alarm signal 315. If the controller 31 of the battery packs 30 monitors that the other battery pack 30 is transmitting signal via the dedicated channel, it will not transmit the alarm signal 315 via the dedicated channel until the other battery pack 30 completes the transmission of signal. Thus, the battery monitoring system 100 of the present invention transmits the alarm signal 315 by the adoption of the dedicated channel, which can not only reduce other RF signals to interfere with the transmission of the alarm signal 315, but also prohibit a condition that more than two battery packs 30 transmit the alarm signals 315 at the same time, and therefore a collision of the signals can be avoided.

Figure 5:
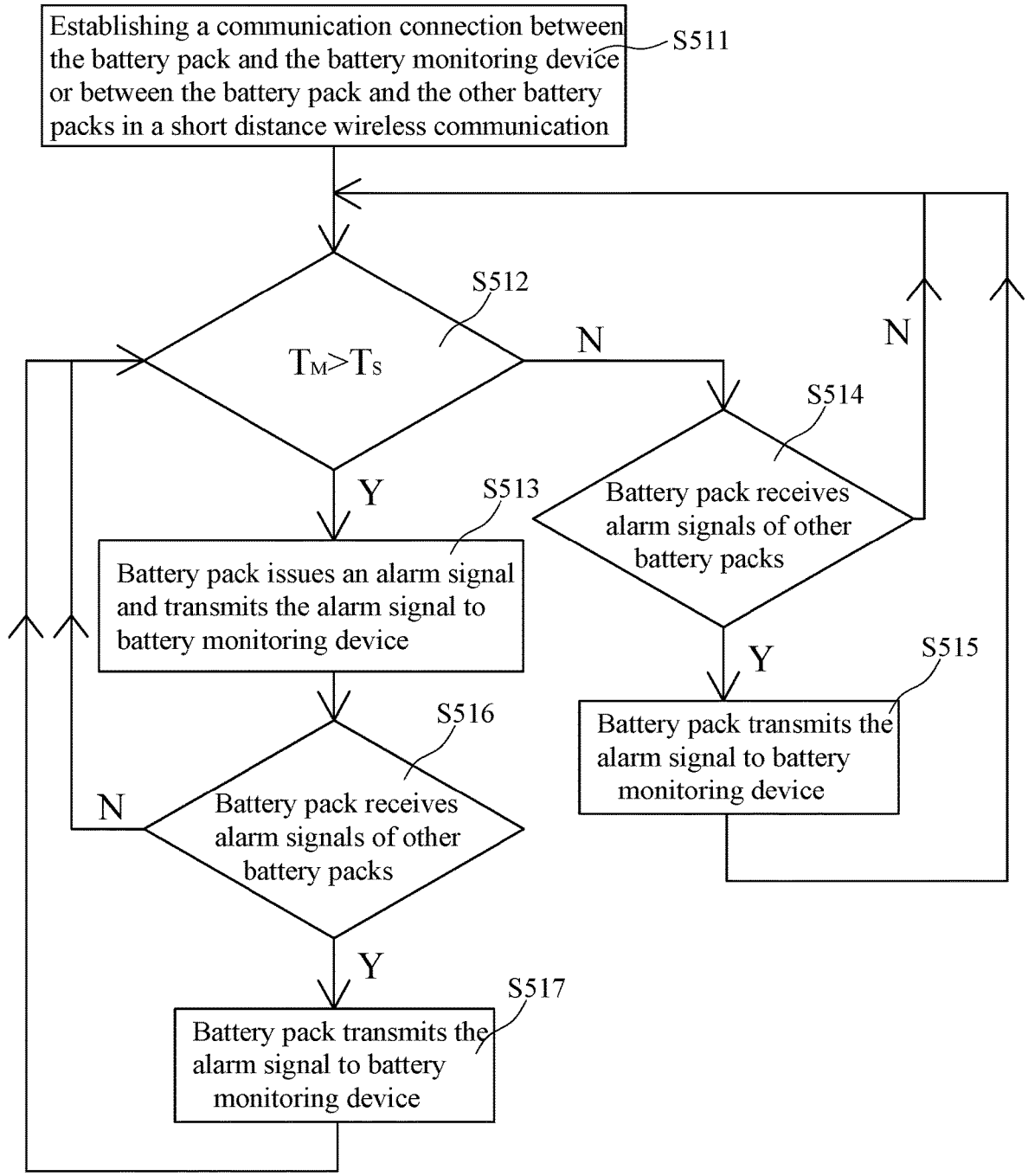
FIG. 5 is a flow chart of a battery monitoring method of the present invention.

Referring to FIG. 5, there is shown a flow chart of a battery monitoring method of the present invention. As shown in FIG. 5, firstly, in step 511, a communication connection is established between the battery packs 30, or established between the battery packs 30 and the battery monitoring device 10. The controller 31 of each of the battery packs 30 is operated in a sleep mode in advance.

In step S512, the controller 31 of the battery pack 30 monitors whether the battery temperature value ($T_M$) 371 of the battery pack 30 is higher than the safe temperature value ($T_S$) 370. If the battery temperature value ($T_M$) 371 of the battery pack 30 is higher than the safe temperature value ($T_S$) 370, continuing to perform step S513, the operation mode of the controller 31 of the battery pack 30 is changed from the sleep mode to a high alarm mode, the controller 31 of the battery pack 30 issues the alarm signal 315, directly transmits the alarm signal 315 to the battery monitoring device 10 in the short distance wireless communication, or transmits the alarm signal 315 to the battery monitoring device 10 via the multi-hop transmission of multiple battery packs 30 in the short distance wireless communication. The alarm signal 315 will be displayed on the alarm notification unit 15 after the battery monitoring device 10 receives the alarm signal 315 issued by the overheating battery pack 30. On the contrary, in step S512, if the battery temperature value ($T_M$) 371 of the battery pack 30 is not higher than the safe temperature value ($T_S$) 370, continuing to perform step S514, the controller 31 of the battery pack 30 monitors whether the alarm signal 315 of the other battery pack 30 has received. In step S514, if the battery pack 40 receives the alarm signals 315 of the other battery packs 30, the operation mode of the controller 31 of the battery pack 30 is changed from the sleep mode to a low alarm mode; then, continuing to perform step S515, the battery pack 30 assists to transmit the alarm signal 315 of the other battery pack 30 to the battery monitoring device 10, and then the alarm signal 315 received by the battery monitoring device 10 will be displayed on the alarm notification unit 15 of the battery monitoring device 10. In step S514, if the battery pack 30 does not receive the alarm signal 315 of the other battery pack 30, the operation mode of the controller 31 of the battery pack 30 will remain in the sleep mode, returning to step S512.

Returning to step S513 again, the battery pack 30 continues to perform step S516 after issuing the alarm signal 315, and transmitting the alarm signal 315 to the battery monitoring device 10, the controller 31 of the battery pack 30 monitors whether the alarm signal 315 of the other battery pack 30 has received. In step S516, if the battery pack 40 receives the alarm signal 315 of the other battery pack 30, continuing to perform step S517, the battery pack 30 assists to transmit the alarm signal 315 of the other battery pack 30 to the battery monitoring device 10, and then the alarm signal 315 received by the battery monitoring device 10 will be displayed on the alarm notification unit 15 of the battery monitoring device 10. On the contrary, in step S516, if the battery pack 30 does not receive the alarm signal 315 of the other battery pack 30, returning to step S512.

In one embodiment of the present invention, the alarm signal 315 transmitted by the battery pack 30 includes an overheating message 316 embedded with an alarm temperature value 372. In step S513, if the battery temperature value ($T_M$) 371 of the battery pack 30 is higher than the safe temperature value ($T_S$) 370, the controller 31 of the battery pack 30 marks the battery temperature value ($T_M$) 371 as the alarm temperature value 372, records the alarm temperature value 372 in the temperature recording unit 313, and embeds the alarm temperature value 372 in the overheating message 316 of the alarm signal 315 to be transmitted. Otherwise, in step S515, if the battery temperature value ($T_M$) 371 of the battery pack 30 is not higher than the safe temperature value ($T_S$) 370 and the battery pack 30 receives the alarm signals 315 of the other battery packs 30, the controller 31 of the battery pack 30 extracts the alarm temperature values 372 of the other battery packs 30 from the overheating messages 316 of the alarm signals 315 received, recognizes a highest alarm temperature value 372 from the alarm temperature values 372 of the other battery packs 30, updates the highest alarm temperature value 372 to the temperature recording unit 313, and embeds the highest alarm temperature value 372 in the overheating message 316 of the alarm signal 315 to be transmitted. Otherwise, in step S517, if the battery temperature value ($T_M$) 371 of the battery pack 30 is higher than the safe temperature value ($T_S$) 370 and the battery pack 30 receives the alarm signals 315 of the other battery packs 30, the controller 31 of the battery pack 30 extracts the alarm temperature values 372 of the other battery packs 30 from the overheating messages 316 of the alarm signals 315 received, recognizes a highest alarm temperature value 372 from the alarm temperature value 372 recorded in the temperature recording unit 313 and those alarm temperature values 372 of the other battery packs 30, updates the highest alarm temperature value 372 to the temperature recording unit 313, and embeds the highest alarm temperature value 372 in the overheating message 316 of the alarm signal 315 to be transmitted. Thus, the highest alarm temperature value 372 in the overheating message 316 will be displayed on the alarm notification unit 15 after the battery monitoring device 10 receives the alarm signal 315 including the overheating message 316.

In one embodiment of the present invention, the alarm signal 315 transmitted by the battery pack 30 includes an overheating message 316 embedded with a count value (C) 318 for indicating the number of the overheating battery packs 30. In step S513, if the battery temperature value ($T_M$) 371 of the battery pack 30 is higher than the safe temperature value ($T_S$) 370, the controller 31 of the battery pack 30 records the count value (C) 318 as 1, such as C=1, by the counter 317, and embeds the count value (C=1) 318 to the overheating message 316 of the alarm signal 315 to be transmitted. Otherwise, in step S515, if the battery temperature value ($T_M$) 371 of the battery pack 30 is not higher than the safe temperature value ($T_S$) 370 and the battery pack 30 receives the alarm signals 315 of the other battery packs 30, the controller 31 of the battery pack 30 extracts the count values 318 of the other battery packs 30 from the overheating messages 316 of the alarm signals 315 received, recognizes a highest count value (C=X) 318 from the count values 318 extracted, adds 1 to the highest count value (C=X) 318 to obtain an updated highest count value (C=X+1) 318, records the updated highest count value (C=X+1) 318 in the counter 317, and embeds the updated highest count value (C=X+1) 318 in the overheating message 316 of the alarm signal 315 to be transmitted. Otherwise, in step S517, if the battery temperature value ($T_M$) 371 of the battery pack 30 is higher than the safe temperature value ($T_S$) 370 and the battery pack 30 receives the alarm signal 315 of the other battery pack 30, the controller 31 of the battery pack 30 extracts the count values 318 of the other battery packs 30 from the overheating messages 316 of the alarm signals 315 received, recognizes a highest count value (C=X) 318 from the count values 318 extracted, adds 1 to the highest count value (C=X) 318 to obtain an updated highest count value (C=X+1) 318, records the updated highest count value (C=X+1) 318 in the counter 317, and embeds the updated highest count value (C=X+1) 318 in the overheating message 316 of the alarm signal 315 to be transmitted. Thus, the highest count value (C) 318 in the overheating message 316 will be displayed on the alarm notification unit 15 after the battery monitoring device 10 receives the alarm signal 315 including the overheating message 316.

Accordingly, the highest alarm temperature value 372 and the highest count value 318 are embedded in the overheating message 316 of the alarm signal 315. When the battery monitoring device 10 receives the alarm signal 315, the highest alarm temperature value 372 and the highest count value 318 will be displayed on the alarm notification unit 15. Afterwards, the manager of the battery monitoring device 10 can know whether a flame spread or a thermal runaway has been happened according to the highest alarm temperature value 372 and the highest count value 318 displayed, and further determine whether an overheating protection is immediate required for these battery packs 30.

The above disclosure is only the preferred embodiment of the present invention, and not used for limiting the scope of the present invention. All equivalent variations and modifications on the basis of shapes, structures, features and spirits described in claims of the present invention should be included in the claims of the present invention.

The invention claimed is:

1. A system for monitoring temperature of battery pack in storage, comprising:
a battery monitoring device comprising a first short distance wireless communication module and an alarm notification unit connected to the first short distance wireless communication module; and
at least one battery pack in storage, wherein the battery pack comprises a battery cell, a controller, a second short distance wireless communication module, and a temperature sensor, the controller is connected to the battery cell, the second short distance wireless communication module, and the temperature sensor, a safe temperature value is set in the controller, the temperature sensor senses a temperature of the battery cell to generate a battery temperature value, the battery pack is connected to the first short distance wireless communication module of the battery monitoring device via the second short distance wireless communication module, or the battery pack is connected to the second short distance wireless communication module of an at least one adjacent other battery pack via the second short distance wireless communication module;
wherein, an operation mode of the controller of the battery pack is operated in a sleep mode in advance; if the battery temperature value of the battery pack is higher than the safe temperature value, the operation mode of the controller of the battery pack will be changed from the sleep mode to a high alarm mode, and then the controller of the battery pack issues an alarm signal, and directly transmits the alarm signal to the battery monitoring device in a short distance wireless communication, or transmits the alarm signal to the battery monitoring device via a multi-hop transmission in the short distance wireless communication; if the battery temperature value of the battery pack is not higher than the safe temperature value and the battery pack receives an alarm signal of the other battery pack, the operation mode of the controller of the battery pack will be changed from the sleep mode to a low alarm mode, and then the battery pack assists to transmit the alarm signal of the other battery pack in a way of the short distance wireless communication; when the battery monitoring device receives the alarm signal, the alarm signal will be displayed on the alarm notification unit.

2. The system according to claim 1, when the controller of the battery pack is operated in the low alarm mode, if the battery temperature value of the battery pack is higher than the safe temperature value, the operation mode of the controller of the battery pack will be changed from the low alarm mode to the high alarm mode, and the controller of the battery pack will issue the alarm signal.

3. The system according to claim 1, wherein the alarm signal includes an overheating message, when the battery monitoring device receives the alarm signal, a microprocessor of the battery monitoring device can know that the alarm signal is an alarm signal indicating that the battery pack is overheated by recognizing the overheating message from the alarm signal.

4. The system according to claim 3, wherein the controller of the battery pack comprises a temperature recording unit, if the battery temperature value of the battery pack is higher than the safe temperature value, the controller of the battery pack marks the battery temperature value as an alarm temperature value, records the alarm temperature value in the temperature recording unit, and embeds the alarm temperature value in the overheating message of the alarm signal to be transmitted.

5. The system according to claim 4, wherein if the battery temperature value of the battery pack is higher than the safe temperature value and the battery pack receives alarm signals of the other battery packs, the controller of the battery pack extracts alarm temperature values of the other battery packs from overheating messages of the alarm signals received, recognizes a highest alarm temperature value from the alarm temperature value recorded in the temperature recording unit and the alarm temperature values of the other battery packs extracted, records the highest alarm temperature value in the temperature recording unit, and embeds the highest alarm temperature value in the overheating message of the alarm signal to be transmitted.

6. The system according to claim 4, wherein if the battery temperature value of the battery pack is not higher than the safe temperature value and the battery pack receives alarm signals of the other battery packs, the controller of the battery pack extracts alarm temperature values of the other battery packs from overheating messages of the alarm signals received, recognizes a highest alarm temperature value from the alarm temperature values of the other battery packs extracted, records the highest alarm temperature value to the temperature recording unit, and embeds the highest alarm temperature value in the overheating message of the alarm signal to be transmitted.

7. The system according to claim 3, wherein the controller of the battery pack comprises a counter, the counter counts a count value for indicating the number of overheating battery packs, if the battery temperature value of the battery pack is higher than the safe temperature value, the controller of the battery pack counts the count value as 1 by the counter, and embeds the count value to the overheating message of the alarm signal to be transmitted.

8. The system according to claim 7, wherein if the battery temperature value of the battery pack is higher than the safe temperature value and the battery pack receives alarm signals of the other battery packs, the controller of the battery pack extracts count values of the other battery packs from overheating messages of the alarm signals received, recognizes a highest count value from the count values extracted, adds 1 to the highest count value to obtain an updated highest count value, records the updated highest count value in the counter, and embeds the updated highest count value in the overheating message of the alarm signal to be transmitted.

9. The system according to claim 7, wherein if the battery temperature value of the battery pack is not higher than the safe temperature value and the battery pack receives alarm signals of the other battery packs, the controller of the battery pack extracts count values of the other battery packs from overheating messages of the alarm signals received, recognizes a highest count value from the count values extracted, records the highest count value in the counter, and embeds the highest count value in the overheating message of the alarm signal to be transmitted.

10. The system according to claim 1, wherein the alarm notification unit is a display, a light emitter, a buzzer, or a human-machine interface capable of displaying signal.

11. The system according to claim 1, wherein the first short distance wireless communication module or the second short distance wireless communication module is a wireless communication module conforming to Bluetooth standard transmission specification, WiFi standard transmission specification, ZigBee standard transmission specification, or ANT standard transmission specification.

12. A method for monitoring temperature of battery pack in storage, which is applied to a battery monitoring system, the battery monitoring system comprising a battery monitoring device and at least one battery pack in storage, the battery monitoring device comprising an alarm notification unit, the battery pack comprising a battery cell, a controller, and a temperature sensor, wherein a safe temperature value is set in the controller, and the temperature sensor is used to sense a temperature of the battery cell in the battery pack to generate a battery temperature value, the method comprising steps of:

presetting an operation mode of the controller of the battery pack to be in a sleep mode;

establishing a communication connection between the battery pack and the battery monitoring device or between the battery pack and other battery pack in a way of a short distance wireless communication;

requiring the controller of the battery pack to periodically monitor whether the battery temperature value of the battery pack is higher than the safe temperature value and whether the battery pack receives an alarm signal of the other battery pack;

changing the operation mode of the controller of the battery pack from the sleep mode to a high alarm mode and issuing an alarm signal of the battery pack by the controller of the battery pack if the battery temperature value of the battery pack is higher than the safe temperature value;

changing the operation mode of the controller of the battery pack from the sleep mode to a low alarm mode and transmit the alarm signal of the other battery pack if the battery temperature value of the battery pack is not higher than the safe temperature value and the battery pack receives the alarm signal of the other battery pack;

requiring the controller of the battery pack to directly transmit the alarm signal of the battery pack or the other battery pack to the battery monitoring device in the way of the short distance wireless communication, or requiring the controller of the battery pack to transmit the alarm signal of the battery pack or the other battery pack to the battery monitoring device via a multi-hop transmission in the way of the short distance wireless communication; and displaying the alarm signal received by the battery monitoring device on the alarm notification unit.

13. The method according to claim 12, wherein the controller of the battery pack comprises a temperature recording unit, if the battery temperature value of the battery pack is higher than the safe temperature value, the method further comprising steps of:

requiring the controller of the battery pack to mark the battery temperature value of the battery pack as an alarm temperature value, record the alarm temperature value in the temperature recording unit, and embed the alarm temperature value in an overheating message of the alarm signal to be transmitted.

14. The method according to claim 13, wherein if the battery temperature value of the battery pack is higher than the safe temperature value and the battery pack receives alarm signals of other battery packs, the method further comprising steps of:
requiring the controller of the battery pack to extract alarm temperature values of the other battery packs from overheating messages of the alarm signals received, recognize a highest alarm temperature value from the alarm temperature value recorded in the temperature recording unit and the alarm temperature values of the other battery packs extracted, record the highest alarm temperature value in the temperature recording unit, and embed the highest alarm temperature value in the overheating message of the alarm signal to be transmitted.

15. The method according to claim 13, wherein if the battery temperature value of the battery pack is not higher than the safe temperature value and the battery pack receives the alarm signals of other battery packs, the method further comprising steps of:
requiring the controller of the battery pack to extract alarm temperature values of the other battery packs from overheating messages of the alarm signals received, recognize a highest alarm temperature value from the alarm temperature values of the other battery packs extracted, record the highest alarm temperature value in the temperature recording unit, and embed the highest alarm temperature value in the overheating message of the alarm signal to be transmitted.

16. The method according to claim 12, wherein the controller of the battery pack comprises a counter, the counter counts a count value for indicating the number of overheating battery packs, if the battery temperature value of the battery pack is higher than the safe temperature value, the method further comprising steps of:
requiring the controller of the battery pack to count the count value as one by the counter, and embed the count value to the overheating message of the alarm signal to be transmitted.

17. The method according to claim 16, wherein if the battery temperature value of the battery pack is higher than the safe temperature value and the battery pack receives alarm signals of other battery packs, the method further comprising steps of:
requiring the controller of the battery pack to extract count values of the other battery packs from overheating messages of the alarm signals received, recognize a highest count value from the count values extracted, adds 1 to the highest count value to obtain an updated highest count value, record the updated highest count value in the counter, and embed the updated highest count value in the overheating message of the alarm signal to be transmitted.

18. The method according to claim 16, wherein if the battery temperature value of the battery pack is not higher than the safe temperature value and the battery pack receives alarm signals of other battery packs, the method further comprising steps of:
requiring the controller of the battery pack to extract count values of the other battery packs from overheating messages of the alarm signals received, recognize a highest count value from the count values extracted, record the highest count value in the counter, and embed the highest count value in the overheating message of the alarm signal to be transmitted.

19. The method according to claim 16, wherein the operation mode of the controller of the battery pack is operated in the low alarm mode, the method further comprising steps of:
changing the operation mode of the controller of the battery pack from the low alarm mode to the high alarm mode and issuing the alarm signal of the battery pack by the controller of the battery pack if the battery temperature value of the battery pack is higher than the safe temperature value.

* * * * *